（12） United States Patent
Robinson (10) Patent No.: US 7,943,106 B2
(45) Date of Patent: May 17, 2011

(54) RARE EARTH NANORODS (75) Inventor: John Sydney Robinson, Currambine (AU)

(73) Assignee: Antaria Limited, Welshpool WA (AU)

( * ) Notice: Subject to any disclaimer, the term of this patent is extended or adjusted under 35 U.S.C. 154(b) by 0 days.

(21) Appl. No.: 11/908,877

(22) PCT Filed: Mar. 17, 2006

(86) PCT No.: PCT/AU2006/000362
§ 371 (c)(1),
(2), (4) Date: Jul. 21, 2008

(87) PCT Pub. No.: WO2006/096936
PCT Pub. Date: Sep. 21, 2006

(65) Prior Publication Data
US 2008/0279744 A1    Nov. 13, 2008

(30) Foreign Application Priority Data
Mar. 18, 2005   (AU) .............................. 2005901334

(51) Int. Cl.
*C01F 17/00*  (2006.01)
(52) U.S. Cl. ..................................... 423/263; 423/21.1
(58) Field of Classification Search .................. 423/263; 428/357
See application file for complete search history.

(56) References Cited

U.S. PATENT DOCUMENTS

| 3,024,199 A | 3/1962 | Pasfield | |
| 2007/0154709 A1* | 7/2007 | Koch et al. | 428/379 |
| 2008/0138267 A1* | 6/2008 | Yadav | 423/263 |
| 2009/0011235 A1* | 1/2009 | Suib et al. | 428/401 |

FOREIGN PATENT DOCUMENTS

WO  2005062785 A2  7/2005

OTHER PUBLICATIONS

Hydrothermal growth and characterization of La(OH)3 nanorods and nanocables with Ni(OH)2 coating. Deng et al. Journal of Physics and Chemistry of Solids. Elsevier. 64 (2003) 607-610.*
Guo, L., et al., "Synthesis and Optical Properties of Crystalline Polymer-Capped ZnO Nanorods." Materials Science and Engineering C 16 (2001): 123-127.
Hsu, Wan Peter, et al., "Preparation and Properties of Monodispersed Colloidal Particles of Lanthanide Compounds. 2. Cerium (IV)." Langmuir vol. 4 No. 1(1988): 31-37.

(Continued)

*Primary Examiner* — Jerry Lorengo
*Assistant Examiner* — Jared Wood
(74) *Attorney, Agent, or Firm* — Edell, Shapiro & Finnan, LLC (57) ABSTRACT A process for the production of nanorods containing a rare earth metal is disclosed. The process comprises the steps of: (a) increasing the pH of an aqueous solution of the formula $MX_3$, where M is a trivalent rare earth metal cation and X is a monovalent anion so as to produce a reaction product containing X anions in solution and a precipitate in the form of trivalent rare earth hydroxide nanoparticles of the formula $M(OH)_3$, the nanoparticles having a hexagonal crystal structure; and, (b) ageing the nanoparticles of step (a) in the presence of the reaction product containing X anions in solution so as to cause rod-like anisotropic growth of the nanoparticles and form rare earth hydroxide nanorods.

21 Claims, 7 Drawing Sheets (a)

(b)

OTHER PUBLICATIONS

Huang, Michael H., et al., "Catalytic Growth of Zinc Oxide Nanowires by Vapor Transport." Advanced Materials 13 No. 2 (2001): 113-116.

Ma, Xiangyang, et al., "Synthesis of Ultrafine Lanthanum Hydroxide Nanorods by a Simple Hydrothermal Process." Materials Letters 58 (2004): 1180-1182.

Mai, Hao-Xin, et al., "Shape-Selective Synthesis and Oxygen Storage Behavior of Ceria Nanopolyhedra, Nanorods, and Nanocubes." Journal of Physics and Chemistry B 109 (2005): 24380-24385.

Matijevic, Egon, et al., "Preparation and Properties of Monodispersed Colloidal Particles of Lanthanide Compounds." Journal of Colloid and Interface Science vol. 118, No. 2 (1987): 507-523.

Mayers, Brian, et al., "One-dimensional Nanostructures of Trigonal Tellurium with Various Morphologies Can Be Synthesized Using a Solution-Phase Approach", The Royal Society of Chemistry 12 (2002): 1875-1881.

Ozawa, Masakuni, et al., "Morphology and Sintering of CeO2, Powders Produced by Homogeneous Precipitation Method." Journal of the Japan Society of Powder and Powder Metallurgy vol. 50, No. 5 (2003): 354-358.

Wang, N., et al., "Nucleation and Growth of Si Nanowires from Silicon Oxide." Rapid Communications Physical Review vol. 58, No. 24 (1998): R16024-R16026.

Wang, Xun, et al., "Synthesis and Characterization of Lanthanide Hydroxide Signle-Crystal Nanowires." Communications 41 No. 24. (2002): 4790-4793.

Wang, Xun, et al., "Rare Earth Compound Nanotubes." Advanced Materials 15 No. 17 (2003): 1442-1446.

Wang, Xun, et al. "Rare-Earth-Compound Nanowires, Nanotubes, and Fullerene-Like Nanoparticles: Synthesis, Characterization, and Properties." Chemistry—A European Journal 9 (2003): 5627-5635.

Wu, Yiying, et al., "Direct Observation of Vapor-Liquid-Solid Nanowire Growth." Journal of the American Chemical Society 123 (2001): 3165-3166.

Zhou, Kebin, et al., "Enhanced Catalytic Activity of Ceria Nanorods from Well-Defined Reactive Crystal Planes." Journal of Catalysis 229 (2005): 206-212.

* cited by examiner

RARE EARTH NANORODS

FIELD OF THE INVENTION

The present invention relates to a process for the production of nanorods containing one or more rare earth elements. The nanorods so produced are particularly, though not exclusively, suited for use in a fuel cell electrode or fuel cell electrolyte material.

BACKGROUND TO THE INVENTION

Ever since the discovery of carbon nanotubes, there has been great interest in the synthesis of 1-dimensional "nanostructures". The rare earth elements are distinguished from other elements by their unique electron configuration which results in them having unique electrical, magnetic, optical and nuclear properties. Nanorods and nanotubes of rare earth oxides have great potential for use in catalyst and fuel cell applications, electronic and optoelectronic nanodevices. In particular cerium oxide and doped cerium oxide exhibits unique oxygen storage capacity, redox behaviour and ionic conductivity, the extent of which is likely to be dependent upon surface area and lattice structure. As such, considerable interest has surrounded efforts to produce high surface area cerium oxide based particles with unique morphology and high thermal stability.

Existing methods for the synthesis of 1-dimensional nanostructures described in the literature can be broadly classified in terms of methods that rely on vapour phase growth and methods that rely on solution based growth. Vapour phase growth typically relies on the evaporation of a suitable precursor material in a controlled atmosphere to produce elemental or oxide nanorods. Existing methods often require the use of a metallic nanoparticle catalyst. For example, Ge nanowires were grown over Au catalyst particles by the evaporation of Ge under vacuum [Wu Y. & Yang P. J. Am. Chem. Soc 123 (2001), p 3165-3166]; Si nanowires were generated by laser ablation and evaporation of Si and SiO2 under an argon atmosphere [Wang N. et al. *Physical Review B* 58 (1998), pR16024-16026]; and, ZnO nanowires were grown on Au coated Si substrates by heating a mixture of ZnO and graphite under an argon atmosphere [Huang MH. Et al. *Advanced Materials* 13 No2 (2001), p 113-116].

Solution based methods typically involve precipitation and growth from a solution with rod-like morphology being generated due to anisotropic growth dictated by crystal structure or through use of templates or capping agents which restrict growth in all but one direction. For example, it has been reported that the anisotropic nature of Te facilitated the formation of Te nanorods by the reduction of orthotelluric acid by hydrazine at various refluxing temperatures [Mayers B & Xia Y. J. Mater. Chem. 12 (2002) p 1875-1881]. ZnO rods were formed using a poly(vinyl pyrrolidone) capping agent during precipitation from a zinc acetate/propanol solution [Guo L. et al Materials Science & Engineering C 16 (2001), p 123-127].

Chemical synthesis of spherical and rod-like particulate rare earth compounds has been reported in the literature. Colloidal Gd, Eu, Tb, Sm and Ce(III) compounds were produced by aging rare earth salts at elevated temperatures in the presence of urea [Matijevic E & Hsu WP. *J. Colloid and Interface Science* 118 (1987) p 506-523]. The forced hydrolysis of Ce(IV) ions in the presence of sulphate ions in sealed tubes at 90° C. was reported to result in the formation of spherical or rod-like particles of hydrated cerium (IV) oxide [Hsu WP et al. *Langmuir* 4 (1988) p 31-37]. Rod-like particles of $CeO_2$ were synthesised by a homogeneous precipitation method, whereby cerium nitrate solution was reacted with hexamethylenetetramine (HMT) and aged at 90° C. for 24 hours [Masakuni O et al. *Journal of the Japan Society of Powder and Powder Metallurgy* 50 (2003), p 354-358].

It has been reported that rare earth hydroxide nanowires can be synthesised by first dissolving $Ln_2O_3$ in concentrated $HNO_3$ and then precipitating nanoparticles of $Ln(OH)_3$ by adding KOH. Rod-like morphology was developed when the precipitate was subjected to subsequent hydrothermal treatment at 180° C. in a sealed autoclave for 12-24 hours [Wang X & Li Y. Angew. *Chem. Int. Ed.* 41 (2002), p 4790-4793]. In a related study, rare earth hydroxide nanotubes were synthesized by first dissolving $Ln_2O_3$ in dilute $HNO_3$, then precipitating nanoparticles of $Ln(OH)_3$ by the addition of KOH or NaOH. Tube-like morphology was developed when the precipitate was subjected to subsequent hydrothermal treatment at 120-140° C. in a sealed autoclave for 12-24 hours [Wang X & Li Y. *Advanced Materials* 15 (2003) p 1442-1446].

U.S. Pat. No. 3,024,199 teaches a process for producing stable hydrous rare earth oxide aquasols. An aqueous solution of at least one rare earth metal salt having monovalent anions is contacted with ammonia to produce a precipitate of the corresponding hydrous rare earth oxide. The precipitate is immediately washed to remove the ammonium salts, before peptizing the resulting washed hydrated hydrous rare earth oxide by heating at a temperature of about 60 to 100° C. for 5 to 60 minutes while agitating. The resultant sol contained rod-like particles.

The prior art methods and publications described above typically require the use of expensive starting materials, customised heat treatment facilities and/or specially controlled environments. There remains a need for an alternative method of producing rare earth nanorods. A process that can be conducted under ambient temperature and pressure conditions would be highly desirable.

It will be clearly understood that, although a number of prior art publications are referred to herein, this reference does not constitute an admission that any of these documents forms part of the common general knowledge in the art, in Australia or in any other country. In the statement of invention and description of the invention which follow, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

SUMMARY OF THE INVENTION

According to a first aspect of the present invention there is provided a process for the production of nanorods containing a rare earth metal, the process comprising the steps of:

(a) increasing the pH of an aqueous solution of the formula $MX_3$, where M is a trivalent rare earth metal cation and X is a monovalent anion so as to produce a reaction product containing X anions in solution and a precipitate in the form of trivalent rare earth hydroxide nanoparticles of the formula $M(OH)_3$, the nanoparticles having a hexagonal crystal structure; and, (b) ageing the nanoparticles of step (a) in the presence of the reaction product containing X anions in solution so as to cause rod-like anisotropic growth of the nanoparticles and form rare earth hydroxide nanorods, wherein the step of ageing is conducted at a temperature less than 120° C.

In one embodiment, the step of increasing the pH comprises the step of introducing a base or basic solution to the aqueous solution of the formula $MX_3$. The basic solution may contain ammonia.

The process may further comprise the step of washing the nanorods after the step of ageing using one or more washing cycles. The washed nanorods may then be subjected to the step of drying.

The rare earth hydroxide nanorods may be used as is or subjected to the further step of calcining to produce nanorods of an equivalent rare earth oxide and/or sulfurising the nanorods to produce nanorods of an equivalent rare earth sulfide or oxysulfide.

When the trivalent rare earth metal cation M is cerium, the step of ageing may be conducted under reducing conditions so as to maintain the cerium ions in a trivalent oxidation state. Alternatively, the process may further comprise the step of oxidizing Ce(III) to Ce(IV) state after the step of aging to produce nanorods of Ce(IV) oxide.

The monovalent anion X may be selected from the group consisting of: halide chloride, bromide, iodide, formate, acetate, nitrate and/or perchlorate, with halides, specifically chloride showing good results in one embodiment.

Advantageously the process may be conducted under ambient temperature conditions and/or under atmospheric pressure conditions, significantly reducing capital and operating expenditure. The process could equally be conducted at a temperature less than 80° C., less than 60° C. or less than 40° C.

In one embodiment, the rare earth hydroxide nanorods are solid although it is also possible to produce nanotubes (ie hollow nanorods).

The step of ageing may be conducted for any suitable time interval, for example, up to 2 hours, 8 hours, 15 hours, 2 days, 2 weeks or 3 months.

In step (a), the pH may be increased above 8, 9, 9.5 or 10 to cause precipitation depending on the particular aqueous solution of the formula $MX_3$ being used.

According to a second aspect of the present invention there is provided a fuel cell or catalyst including rare earth nanorods produced in accordance with the process of the first aspect of the present invention.

BRIEF DESCRIPTION OF THE DRAWINGS

In order to facilitate a more detailed understanding of the nature of the invention several embodiments of the improved causticisation process and apparatus will now be described in detail, by way of example only, with reference to the accompanying drawings, in which:

FIG. 2(a) and (b) are transmission electron micrographs at two different magnifications showing nanorods of hydrated cerium oxide as described in Example 1, aged 18 hours in reaction products prior to washing;

DETAILED DESCRIPTION OF PREFERRED EMBODIMENTS

Before specific embodiments of the present invention are described and in the interests of clarity, some of the terms used throughout this specification are now defined.

The term "rare earth" or "rare earth element" as used throughout this specification refers to the following elements: scandium (Sc, 21), yttrium (Y, 39), and lanthanum (La, 57), as well as the 14 lanthanides that are filling the 4f electron shell: cerium (Ce, 58), praseodymium (Pr, 59), neodymium (Nd, 60), promethium (Pm, 61), samarium (Sm, 62), europium (Eu, 63), gadolinium (Gd, 64), terbium (Tb, 65), dysprosium (Dy, 66), holmium (Ho, 67), erbium (Er, 68), thulium (Tm, 69), and ytterbium (Yb, 70).

The term "trivalent rare earth" as used throughout this specification refers to a rare earth element having a valence or oxidation state of +3. While all rare earth elements are trivalent (have an oxidation state of +3) in their most common form, Ce, Pr and Th also exhibit a valence of +4, while Sm, Eu, Tm and Yb also exhibit a valence of +2.

The term "trivalent rare earth salt" refers to a compound of the formula $MX_3$, where M is a trivalent rare earth metal cation and X is a monovalent anion.

The term "trivalent rare earth hydroxide" (also known as a "trivalent rare earth hydrous oxide" or a "trivalent rare earth hydrated oxide") as used throughout this specification refers to a compound of the formula $M(OH)_3$, where M is a trivalent rare earth metal cation.

The term "nanorods" (also referred to in the art as "needles", "whiskers" and "nanowires") as used throughout this specification refers to rod-like particles that have a high aspect ratio in that they are significantly longer in length than in diameter, the diameter of the rod-like particles being typically less than 100 nm in size. The term "nanotubes" is used to describe nanorods that are hollow. Nanorods and nanotubes are collectively referred to as "nanostructures".

The term "base" is used to describe a substance which increases the number of free hydroxide ions (OH—) when added to an aqueous solution. The more hydroxide ions produced, the stronger the base. When a base is mixed with an aqueous solvent, the solution is referred to herein as a "basic solution". A base or basic solution has a pH greater than 7. A "strong base" has a pH of at least 13.

The term "calcination" or "calcining" refers to heat treating in an oxidizing atmosphere.

In its broadest form the process of the present invention comprises two steps. The first step is to precipitate rare earth hydroxide nanoparticles of the formula $M(OH)_3$ from an aqueous solution of the formula $MX_3$ (where M is a trivalent rare earth metal cation and X is a monovalent anion) by increasing the pH. The rare each hydroxide nanoparticles so precipitated have a hexagonal structure. The aqueous solution of the formula $MX_3$ may be prepared as a precursor to the process using any suitable prior art process. As a precursor to the processes of the present invention, the aqueous solution of the formula $MX_3$ is either provided or produced for example by dissolving an equivalent rare earth salt in a suitable solvent, such as water or de-ionised water. Suitable monovalent anions X include, but are not limited to one or more of the following: chloride, bromide, iodide, formate, acetate, nitrate and/or perchlorate. Advantageously, the processes of the present invention have been found to perform well when X is a halide, particularly chloride.

Precipitation occurs regardless of how the rare earth salt solution and the source of free hydroxide ions are brought together. The free hydroxide ions can be present in excess provided only that a sufficient quantity of free hydroxide ions is present to allow the trivalent rare earth hydroxide nanoparticles to form. In one embodiment of the present invention, the source of free hydroxide ions is a base which is added as a solid directly to the rare earth salt solution and mixed therewith to cause precipitation of the trivalent rare earth hydroxides is observed to occur. The source of free hydroxide ions may equally be a basic solution, the base having been dissolved in a suitable solvent such as water or de-ionised water prior to the basic solution being brought into contact with the rare earth salt solution.

In the experimental examples described below, precipitation was observed to occur as the pH increased above 8. In some of the examples, additional free hydroxide ions were present resulting in a pH in the order of 9-10 during precipitation. The particular pH at which precipitation occurs is not critical to the processes of the present invention and it is considered a matter of routine for a person skilled in the art to determine the conditions under which precipitation will occur for a given rare earth salt solution which will depend in a number of factors including the solubility product (Ksp) of the particular type of rare earth salt, the hydroxide concentration, and the temperature and pressure conditions.

A reaction product containing X anions in solution is also formed as a consequence of the precipitation reaction. During the second step in the process, the precipitated rare earth hydroxide nanoparticles are allowed to age in the presence of the reaction product containing X anions in solution. It has been surprisingly observed that during ageing, the morphology of the trivalent rare earth hydroxide nanoparticles changes resulting in rod-like anisotropic growth of the nanoparticles forming nanorods of the rare earth hydroxides. More surprising and highly advantageously, the nanorods are able to be formed using the process of the present invention under ambient temperature and pressure conditions.

For rod-like growth to occur during this ageing step, the trivalent rare earth hydroxide nanoparticles which precipitate from the rare earth salt aqueous solution must have a hexagonal crystal structure. Without wishing to be bound by theory it is understood that the driving force for the anisotropic growth of the hydroxides derives at least in part from the hexagonal crystal structure of these trivalent rare earth hydroxides. Rod-like growth is not observed to occur for every precipitated nanoparticle. It is understood that it is only thermodynamically favorable for nanoparticles above a certain size to change morphology and grow as nanorods during ageing. The larger nanoparticles have a smaller surface area to volume ratio than small nanoparticles. Without wishing to be bound by theory, it is understood that the presence of the reaction product during ageing has an influence on the size and aspect ratio of the nanorods.

The temperature conditions are less critical. It is worth noting that the processes of the present invention, in contrast with prior art processes, may be conducted under ambient pressure and temperature conditions. When the process is conducted entirely under ambient conditions, no restriction is placed on the size of the reaction vessel, allowing for easy scale-up production of large, economic quantities of the hydroxide nanorods. It is to be understood that higher temperatures may equally be used, for example, if it is desirable to grow hollow nanorods After ageing, the reaction product is removed, for example by repeated washing in water or de-ionised water, leaving discrete nanorods of the trivalent rare earth hydroxides. The nanorods may be dried and used as hydroxides. Advantageously, the nanorods may be calcined without change in morphology to produce nanorods of the equivalent rare earth oxide.

The advantages of the various aspects of the present invention are further described and illustrated by the following examples. These examples are illustrative of a variety of possible implementations and are not to be construed as limiting the invention in any way. It will be readily appreciated by persons skilled in the art that the processes of the present invention are equally applicable to rare earth elements other than the ones used in the specific examples and that other methods for increasing the pH other than adding a base may equally be used to practice or test the various aspects of the present invention. In the examples that follow, the processes are described with reference to nanorods containing only one or two rare earth element(s). It is to be understood that the nanorods could equally contain more than two rare earth elements if the starting material(s) contain more than two rare earth elements.

EXAMPLE 1

CeCl3/NH4OH Experiment at ~pH9.5, 0.04 Mol/Liter

An aqueous solution of the formula $MX_3$ was formed by dissolving 5.85 g $CeCl_3.7H_2O$ in 294 g Deionised water. A basic solution made up of 84.6 g $NH_4OH$ at 1.1 mol/l was added drop wise whilst stirring, leading to a concentration of 0.04 mol/l Ce(III) ion. A gelatinous precipitate formed which was light purple in colour, characteristic of hydrated Ce(III) oxide formed in the presence of air. The reaction product of the formula MX was $NH_4Cl$. The resulting slurry of the precipitate and the reaction product was stirred for 5 minutes and had a pH of 9.6. The temperature used for this example was ambient (in the order of 20° C.).

A sample of the resulting slurry was taken after precipitation and prior to ageing and quickly washed by centrifugation using Deionised water, with dilute $NH_4OH$ being added where necessary during washing in order maintain a pH of approximately 9.5 throughout. The un-aged sample was repeatedly washed until the conductivity of the wash water measured less than 100 μS/cm (50 ppm salinity equivalent).

The remaining slurry was allowed to age in the presence of the reaction product under ambient conditions for three (3) months in a closed screw top container. A first sample was taken after ageing for 18 hours and this sample was washed by centrifugation in the manner described above. Further samples were taken at regular intervals during ageing. A final sample was taken at the end of the three month ageing period and also washed in the manner described above. A portion of each of the samples was used for electron microscopy studies with the remainder of the sample being dried at 40° C. and used for BET surface area and x-ray diffraction measurement. During the drying process it was observed that the product changed colour from purple to yellow, which is characteristic of Ce(IV) oxide, indicative of oxidation of the cerium ion from the Ce(III) to Ce(IV) state.

Figure 1:
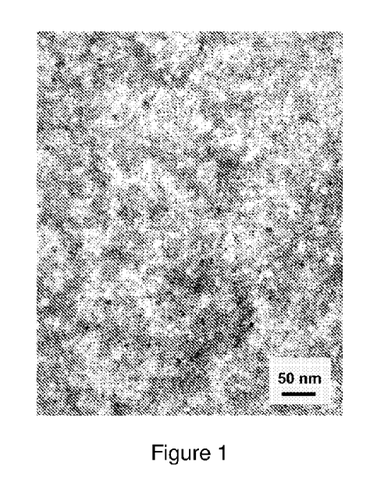
FIG. 1 is a transmission electron micrograph of non-aged hydrated cerium oxide as described in Example 1.

A transmission electron micrograph of the un-aged sample is shown in FIG. 1 which shows a gelatinous precipitate consisting of a collection of equiaxed nano particles approximately 5 nm in size. X-ray diffraction measurements revealed broad peaks corresponding to hydrated $CeO_2$ with the corresponding BET surface area being 181.2 m$^2$/g.

Figure 2:
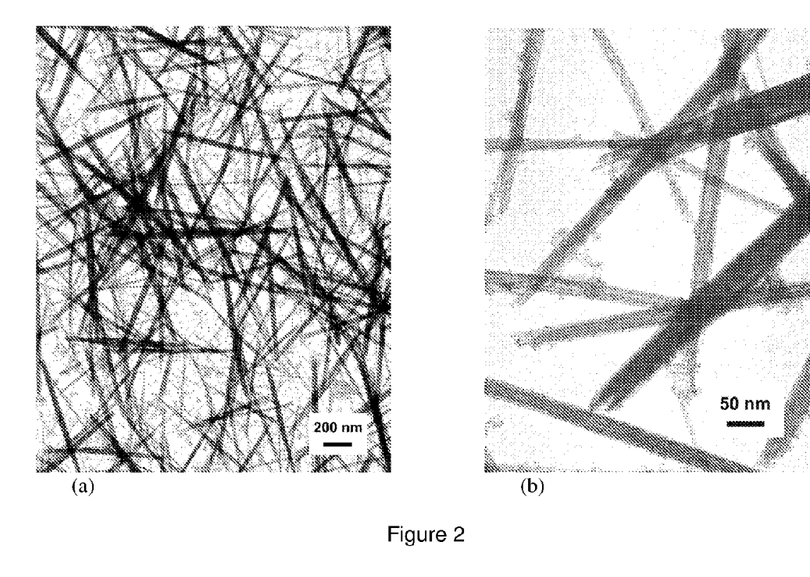

FIG. 2 shows a transmission electron micrograph of the first sample taken after allowing the precipitated nanoparticles to age in the presence of the reaction product for 18 hours prior to washing. As can clearly be seen, the first sample consists primarily of fibrous rod-like particles (nanorods) having a diameter of 10-60 nm and a length of 0.2-1.1 μm with aspect ratio approximately 20:1. A small volume fraction of equiaxed nanoparticles approximately 5 nm in size was also observed. Each nanorod was observed to exhibit a nano substructure consisting of whiskers approximately 10 nm in diameter, bundled together along their longitudinal axes. X-ray diffraction measurements of the first sample revealed broad peaks corresponding to hydrated $CeO_2$ having a corresponding BET surface area of 94.8 m$^2$/g. After 3 months of ageing of the precipitates in the presence of the reaction products, the electron microscopy studies confirmed that the structure of the nanorods produced was essentially equivalent to that observed after 18 hours aging. X-ray diffraction measurements revealed broad peaks corresponding to hydrated $CeO_2$, having a corresponding BET surface area of 79.9 m$^2$/g

EXAMPLE 2

CeCl3/NH4OH Experiment at 0.1 Mol/Liter

An aqueous solution of the formula $MX_3$ was formed by dissolving 5.85 g $CeCl_3 \cdot 7H_2O$ in 70.6 g Deionised water. A basic solution made up of 84.6 g $NH_4OH$ at 1.1 mol/l was added drop wise whilst stirring, leading to a concentration of 0.1 mol/l Ce(III) ion. A gelatinous precipitate was observed which was light purple in colour. The reaction product of the formula MX was $NH_4Cl$. The resulting slurry of the precipitate and the reaction product was stirred for 5 minutes and had a pH of 9.6. The temperature used for this example was ambient (in the order of 20° C.).

A sample was taken after precipitation and prior to ageing and quickly washed by centrifugation using Deionised water, with dilute $NH_4OH$ being added where necessary during washing in order maintain a pH of approximately 9.5 throughout. The un-aged sample was repeatedly washed until the conductivity of the wash water measured less than 100 μS/cm (50 ppm salinity equivalent). The remaining slurry was allowed to age in the presence of the reaction product under ambient conditions for 18 hours in a closed screw top container. Another sample was then taken after ageing and washed by centrifugation in the manner described above. A portion of each of the samples taken was used for electron microscopy studies with the remainder of the sample being dried at 40° C. and used for BET surface area and x-ray diffraction measurement.

Figure 3:
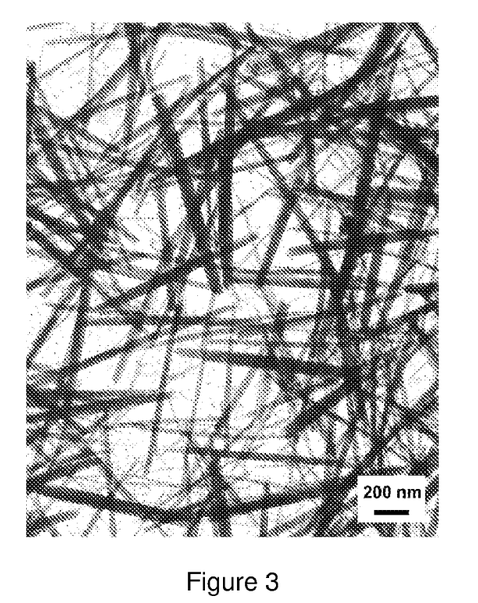
FIG. 3 is a transmission electron micrograph of hydrated ceria as described in Example 2, aged 24 hours in reaction products prior to washing.

It was confirmed by electron microscopy studies that the sample washed immediately after precipitation consisted of agglomerated nanoparticles approximately 5 nm in size. X-ray diffraction measurements revealed broad peaks corresponding to hydrated $CeO_2$, the corresponding BET surface area was 50.7 m$^2$/g. FIG. 3 shows a transmission electron micrograph of the sample aged in reaction products for 18 hours prior to washing. The sample taken after ageing was dominated by nanorods having a diameter of 10-150 nm, 0.2-2 μm long and having an aspect ratio around 15:1. X-ray diffraction measurements revealed broad peaks corresponding to hydrated $CeO_2$, the corresponding BET surface area was 73.6 m$^2$/g.

EXAMPLE 3

CeCl3/NH4OH Experiment at 0.5 Mol/Liter

An aqueous solution of the formula $MX_3$ was formed by dissolving 27.95 g $CeCl_3 \cdot 7H_2O$ in 102.2 g Deionised water. A basic solution made up of 47.76 g $NH_4OH$ at 8 mol/l was added drop wise whilst stirring, leading to a concentration of 0.5 mol/l Ce(III) ion. A gelatinous precipitate was observed which was light purple in colour. The reaction product of the formula MX was $NH_4Cl$. The resulting slurry of the precipitate and the reaction product was stirred for 5 minutes and had a pH of 9.6. The temperature used for this example was ambient (in the order of 20° C.).

A sample of the resulting slurry was taken after precipitation and prior to ageing and quickly washed by centrifugation using Deionised water, with dilute $NH_4OH$ being added where necessary during washing in order maintain a pH of approximately 9.5 throughout. The un-aged sample was repeatedly washed until the conductivity of the wash water measured less than 100 μS/cm (50 ppm salinity equivalent).

The remaining slurry was allowed to age in the presence of the reaction products under ambient conditions in a screw top container. Samples were taken and washed as described above after 18 hours and 48 hours aging time. In each case, a small quantity of the resulting washed sample was used for electron microscopy studies, the remainder was dried at 40° C. and used for BET surface area and x-ray diffraction measurement.

Figure 4:
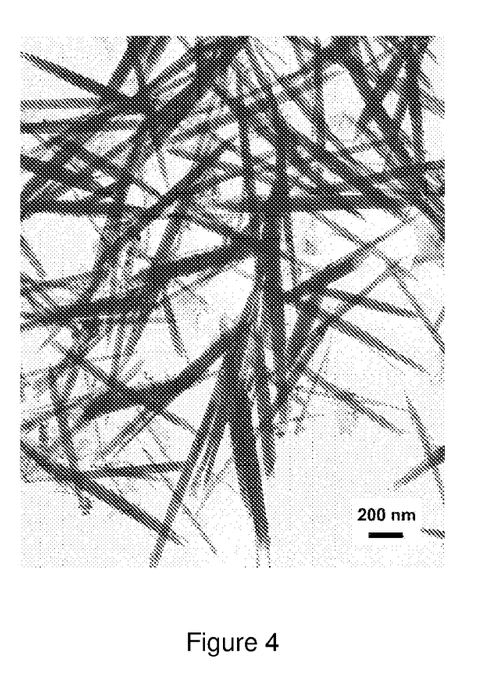
FIG. 4 is a transmission electron micrograph of hydrated ceria as described in Example 3, aged 48 hours in reaction products prior to washing.

It was confirmed by electron microscopy studies that the sample washed immediately after precipitation consisted of agglomerated nanoparticles approximately 5 nm in size. X-ray diffraction measurements revealed broad peaks corresponding to hydrated $CeO_2$, the corresponding BET surface area was 46.1 m$^2$/g. Electron microscopy studies indicated that the sample aged for 18 hours in reaction products was dominated by agglomerated equiaxed nanoparticles, with a low volume fraction of rod-like particles up to 1 μm long, typically with diameter 100 nm. FIG. 4 shows a transmission electron micrograph of the sample aged in reaction products for 48 hours prior to washing. The sample was dominated by nanorods having a diameter of 20-150 nm, 0.2-2 μm long and having an aspect ratio around 10-15:1. X-ray diffraction measurements revealed broad peaks corresponding to hydrated $CeO_2$, the corresponding BET surface area was 40.1 m$^2$/g.

EXAMPLE 4

Bucket Scale-Up of CeCl3/NH4OH Process—~pH9.5

An aqueous solution of the formula $MX_3$ was formed by dissolving 754.3 g $CeCl_3.7H_2O$ in 35 liters of de-ionised water in a 60 liter tank. A basic solution was made up by mixing 738 g of 28% $NH_4OH$ aqueous solution with deionised water to a total volume of 5 liters. The basic solution was slowly poured into the aqueous solution of the formula $MX_3$ whilst stirring leading to a concentration of 0.05 mol/l Ce(III) ion. A gelatinous precipitate was observed which was light purple in colour. The reaction product of the formula MX was $NH_4Cl$. The resulting slurry of the precipitate and the reaction product was stirred for 15 minutes and had a pH of 9.4. The temperature used for this example was ambient (in the order of 20° C.).

A sample of the resulting slurry was taken after precipitation and prior to ageing and quickly washed by centrifugation using Deionised water, with dilute $NH_4OH$ being added where necessary during washing in order maintain a pH of approximately 9.5 throughout. The un-aged sample was repeatedly washed until the conductivity of the wash water measured less than 100 µS/cm (50 ppm salinity equivalent).

The remaining slurry was allowed to age in the presence of the reaction products under ambient conditions in a screw top container for 18 hours. At the end of the 18 hour aging period, the remaining material was washed in the tank by repeated sedimentation followed by decanting, re-filling with fresh Deionised water and stirring under the conditions described above. Samples were taken and washed in the manner described above with a portion being used for electron microscopy studies and the remainder dried at 40° C. and used for BET surface area and x-ray diffraction measurement.

Dried samples which had been aged for 18 hours were calcined at 500° C. for 30 minutes and 850° C. for 2 hours respectively. BET surface area and x-ray diffraction measurements were made on each of the calcined samples in order to assess the thermal stability of the nanorods.

Figure 5:
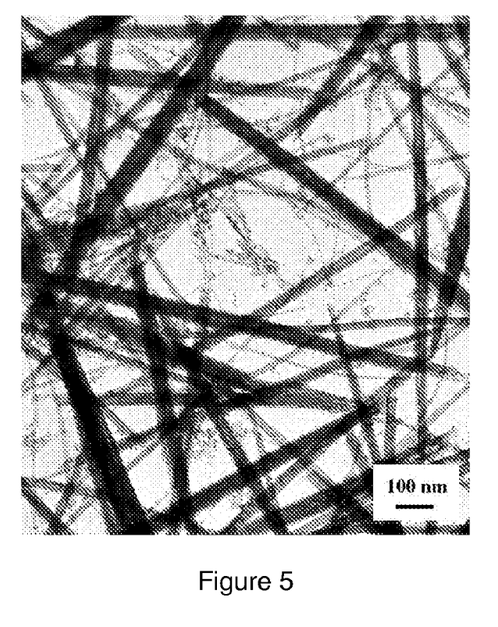
FIG. 5 is a transmission electron micrograph of hydrated cerium oxide as described in Example 4, aged 24 hours in reaction products prior to washing.

It was confirmed by electron microscopy studies that the sample washed immediately after precipitation consisted of a collection of nanoparticles approximately 5 nm in size, similar to those shown in FIG. 1 for Example 1. X-ray diffraction measurements revealed broad peaks corresponding to hydrated $CeO_2$. FIG. 5 shows a transmission electron micrograph corresponding to the bulk sample aged 18 hours in reaction products following washing, the sample was dominated by rod-like particles 350 nm-1.5 µm long, with diameter 10-50 nm and aspect ratio typically 30:1, observed to have a fibrous type sub-structure similar to that exhibited by particles described in Example 1. The corresponding BET surface area was 92.0 $m^2/g$ and x-ray diffraction measurements revealed broad peaks corresponding to hydrated $CeO_2$.

Figure 6:
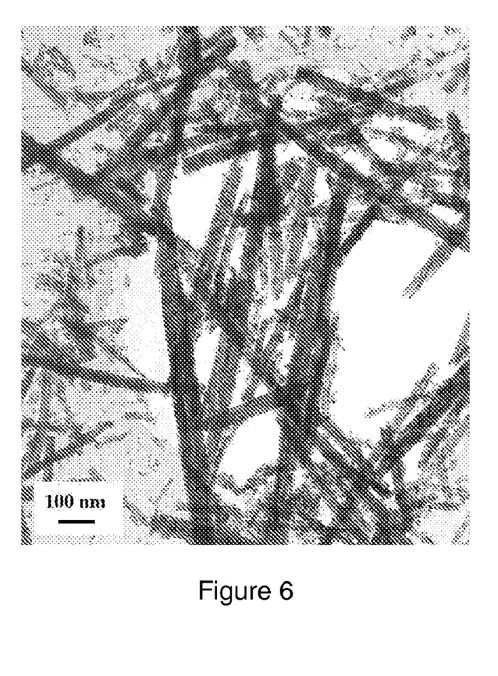
FIG. 6 is a transmission electron micrograph of hydrated cerium oxide as described in Example 4, following calcination at 500° C. for 30 minutes.

FIG. 6 shows a transmission electron micrograph for the sample calcined at 500° C. for 30 minutes illustrating that the rod-like morphology remained after calcination, with each nanorods retaining the nanoscale substructure. It was further observed that many of the thin whisker type nanorods, originally around 10 nm in diameter had broken up, forming equiaxed particles. The corresponding BET surface area was 72.5 $m^2/g$ with X-ray diffraction measurements revealed broad peaks corresponding to Cerium oxide.

Figure 7:
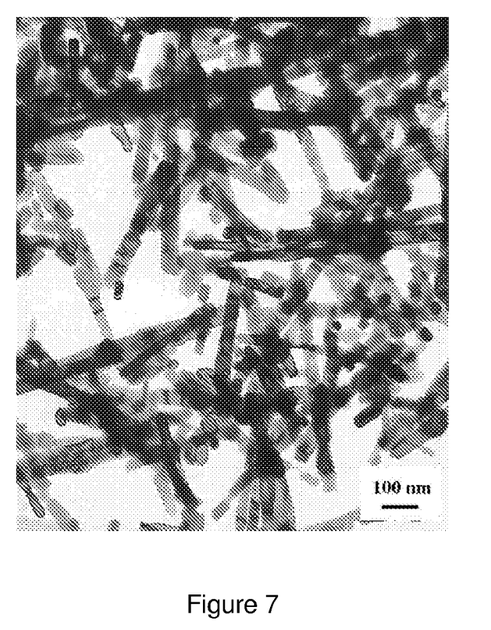
FIG. 7 is a transmission electron micrograph of hydrated cerium oxide as described in Example 4, following calcination at 850° C. for 2 hours.

FIG. 7 shows a transmission electron micrograph for the sample calcined at 850° C. for 2 hours. Rod-like morphology was evident in the sample, with each nanorod appearing to be a single crystal of cerium oxide. The corresponding BET surface area was 17.2 $m^2/g$, x-ray diffraction measurements revealed sharp peaks corresponding to cerium oxide.

EXAMPLE 5

CeCl3/NaOH Experiment at pH12 Leading to Short, Thin Needles

An aqueous solution of the formula $MX_3$ was formed by dissolving 5.87 g $CeCl_3.7H_2O$ in 300 g Deionised water. A basic solution made up of 19.0 g NaOH at 3 mol/l was added drop wise whilst stirring, leading to a concentration of 0.05 mol/l Ce(III) ion. A gelatinous precipitate was observed which was light purple in colour. The reaction product of the formula MX was $NH_4Cl$. The resulting slurry of the precipitate and the reaction product was stirred for 5 minutes and had a pH of 12.2. The temperature used for this example was ambient (in the order of 20° C.).

A small sample of the resulting slurry was quickly washed by centrifugation, using Deionised water, dilute NaOH was added where necessary during washing in order maintain a pH of approximately 12 throughout. The sample was repeatedly washed until the conductivity of the wash water measured less than 100 µS/cm. The remaining slurry was allowed to age in the presence of the reaction products under ambient conditions for 18 hours in a screw top container. At the end of the 18 hour aging period, the sample was washed as described above. In each case, a small portion of the washed sample was used for electron microscopy studies and the remainder was dried at 40° C. and used for BET surface area and x-ray diffraction measurement.

Figure 8:
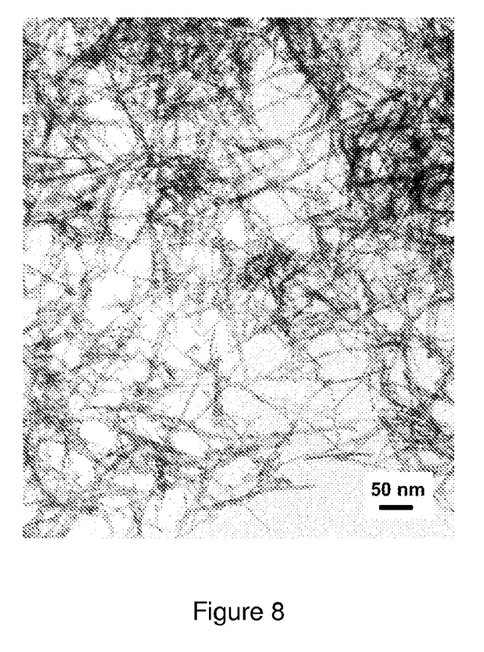
FIG. 8 is a transmission electron micrograph of hydrated cerium oxide as described in Example 5, aged 24 hours in reaction products prior to washing.

It was confirmed by electron microscopy studies that the sample washed immediately after precipitation consisted of a collection of nanoparticles approximately 3-5 nm in size. X-ray diffraction measurements revealed broad peaks corresponding to hydrated $CeO_2$. The corresponding BET surface area was 176.5 $m^2/g$. FIG. 8 shows a transmission electron micrograph of the sample aged in reaction products for 18 hours prior to washing, the sample consisted mainly of nanorods with a diameter of approximately 10 nm and a length of 75-300 nm long, having aspect ratio typically 20:1. X-ray diffraction measurements revealed broad peaks corresponding to hydrated $CeO_2$, the corresponding BET surface area was 173.7 $m^2/g$.

EXAMPLE 6

Precipitation from Mixed Cerium Chloride and Cerium Acetate Solution Leading to Nano Wires An aqueous solution of the formula $MX_3$ was formed by dissolving 4.40 g $CeCl_3.7H_2O$ and 1.44 g $Ce(CH_3COO)_3.nH_2O$ in 290 g Deionised water. A basic solution made up of 85.0 g $NH_4OH$ at 1.1 mol/l was added drop wise whilst stirring, leading to a concentration of 0.04 mol/l Ce(III) ion. A gelatinous precipitate formed which was light purple in colour, characteristic of hydrated Ce(III) oxide formed in the presence of air. The reaction product of the formula MX was a mixture of $NH_4C_1$ and $CH_3COONH_4$. The resulting slurry of the precipitate and the reaction product was stirred for 5 minutes and had a pH of 9.7. The temperature used for this example was ambient (in the order of 20° C.).

A small sample of the resulting slurry was quickly washed by centrifugation, using Deionised water, dilute $NH_4OH$ was added where necessary during washing in order maintain a pH of approximately 9.5 throughout. The sample was repeatedly washed until the conductivity of the wash water measured less than 100 μS/cm. The remaining slurry was allowed to age in the presence of the reaction products under ambient conditions for 48 hours in a screw top container. At the end of the 48 hour aging period, the sample was washed as described above. In each case, a small portion of the washed sample was used for electron microscopy studies and the remainder was dried at 40° C. and used for BET surface area and x-ray diffraction measurement.

Figure 9:
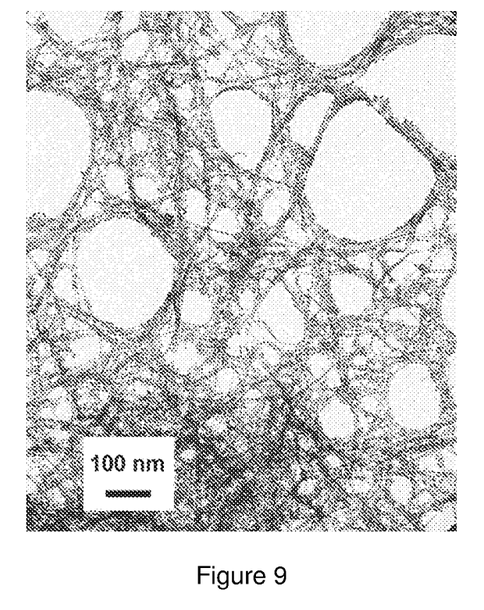
FIG. 9 is a transmission electron micrograph of hydrated cerium oxide as described in Example 6, aged 48 hours in reaction products prior to washing.

It was confirmed by electron microscopy studies that the sample washed immediately after precipitation consisted of a collection of nanoparticles approximately 1-3 nm in size. X-ray diffraction measurements revealed broad peaks corresponding to hydrated $CeO_2$. FIG. 9 shows a transmission electron micrograph of the sample aged in the presence of the reaction products for 48 hours prior to washing. The sample aged in the reaction products consisted of nanorods having a diameter of approximately 5-15 nm, a length of 0.1-1.5 μm and an aspect ratio of approximately 50-100:1. X-ray diffraction measurements revealed broad peaks corresponding to hydrated $CeO_2$, the corresponding BET surface area was 124.5 $m^2/g$.

EXAMPLE 7

LaCl3/NH4OH Process Leading to La(OH)3 Rods

An aqueous solution of the formula $MX_3$ and having a $La^{3+}$ ion concentration of 0.05 mol/l was prepared by dissolving 2.994 g of $La(OH)_3$ in a HCl solution containing 5.2 g 33% HCl and 320.2 g Deionised water. Whilst stirring, 10.8 g of 8 mol/l $NH_4OH$ solution was added dropwise. A white gelatinous precipitate was observed. The reaction product of the formula MX in this example was $NH_4Cl$. The resultant slurry pH was 9.5 and the temperature was 19.1° C., the slurry was stirred for a further 5 minutes. The temperature used for this example was ambient (in the order of 20° C.).

A sample of the resulting slurry was quickly washed by centrifugation, using Deionised water, dilute $NH_4OH$ was added where necessary during washing in order maintain a pH of approximately 9.5 throughout. The sample was repeatedly washed until the conductivity of the wash water measured less than 100 μS/cm. The remaining un-washed slurry was allowed to age under ambient conditions for 3 days in a screw top container. At the end of the aging period, the remaining sample was washed as described above.

Figure 10:
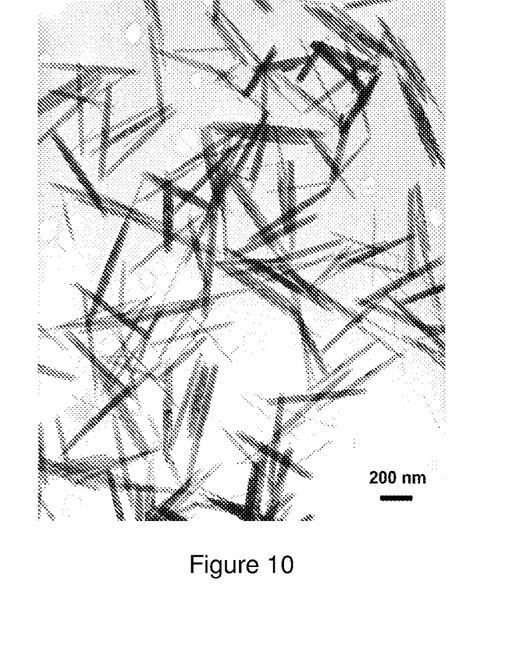
FIG. 10 is a transmission electron micrograph of hydrated lanthanum oxide as described in Example 7, aged 3 days in reaction products prior to washing.

It was confirmed by electron microscopy studies that the sample washed immediately after precipitation consisted of amorphous material. FIG. 10 shows a transmission electron micrograph of the sample aged in the presence of the reaction products for 3 days prior to washing. The sample aged in the reaction products consisted of nanorods having a diameter of approximately 50-100 nm, a length of 0.2-1.2 μm and an aspect ratio of approximately 15:1. Each nanorod exhibited a nano sub-structure, similar to that exhibited by hydrated cerium oxide rod-like particles described in Example 1. X-ray diffraction measurements revealed broad peaks corresponding to lanthanum hydroxide, the corresponding BET surface area was 31.58 $m^2/g$.

EXAMPLE 8

NdCl3/NH4OH Process Leading to Nd(OH)3 Rods

An aqueous solution of the formula $MX_3$ was prepared by dissolving 3.926 g anhydrous $NdCl_3$ in 294 g Deionised water. Whilst stirring, 85.0 g of 1.1 mol/l $NH_4OH$ solution was added dropwise, leading to a concentration of 0.04 mol/l Nd(III) ion. A pale violet coloured gelatinous precipitate was observed. The reaction product of the formula MX in this example was $NH_4Cl$. The resultant slurry pH was 9.7 and the temperature was ambient (in the order of 20° C.).

The precipitated nanoparticles were allowed to age in the reaction product for 18 hours. The resulting slurry was washed by centrifugation, using Deionised water with dilute $NH_4OH$ being added where necessary during washing in order maintain a pH of approximately 9.5 throughout. The sample was repeatedly washed until the conductivity of the wash water measured less than 100 μS/cm.

Figure 11:
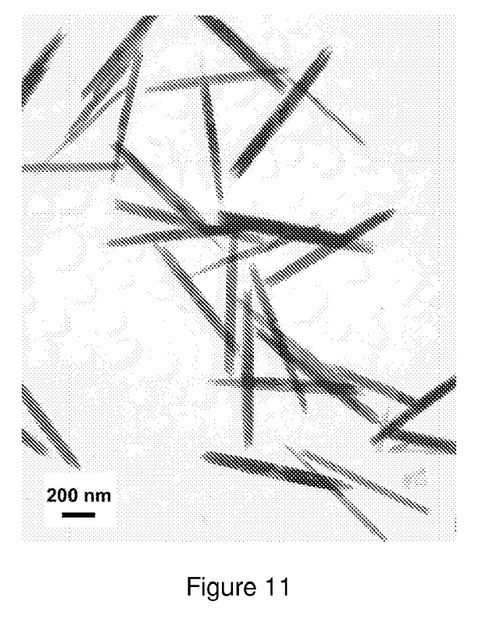
FIG. 11 is a transmission electron micrograph of hydrated neodymium oxide as described in Example 8, aged 18 hours in reaction products prior to washing.

FIG. 11 shows a transmission electron micrograph of the sample aged in the presence of the reaction products for 18 hours prior to washing, the sample consisted of nanorods having a diameter of approximately 20-120 nm, 0.6-1.5 μm long and having an aspect ratio of around 15:1. X-ray diffraction measurements revealed broad peaks corresponding to $Nd(OH)_3$, the corresponding BET surface area was 16.9 $m^2/g$.

EXAMPLE 9

Mixed 90% Ce-10% Nd Process Leading to Ce—Nd (OH)3 Rods

In order to generate rod-like particles of composition 90 mol % hydrated cerium oxide, mol % hydrated neodymium oxide, an aqueous solution was prepared by firstly dissolving 5.266 g $CeCl_3.7H_2O$ and 0.393 g anhydrous $NdCl_3$ in 294 g Deionised water. 85 g of 1.1 mol/l $NH_4OH$ solution was slowly added to the aqueous solution whilst stirring. A dense purple/brown precipitate was observed in a reaction product of the formula MX being $NH_4Cl$. The resultant slurry was stirred for a further 5 minutes and then allowed to age in the reaction products for 7 days under ambient conditions. The resulting slurry was then washed by centrifugation, using Deionised water, dilute $NH_4OH$ was added where necessary during washing in order maintain a pH of approximately 9.5 throughout. The sample was repeatedly washed until the conductivity of the wash water measured less than 100 μS/cm.

Figure 12:
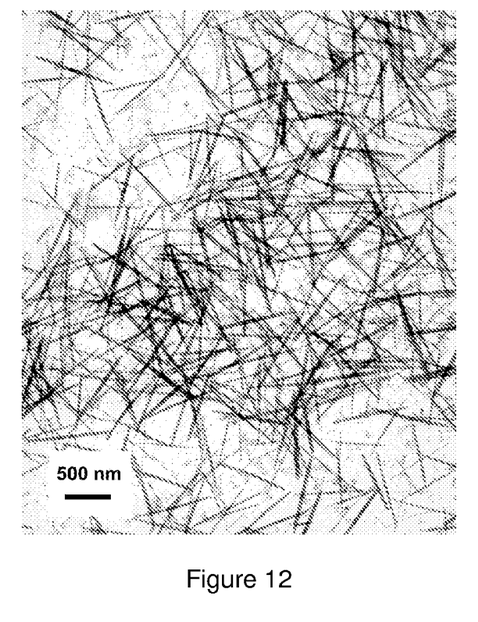
FIG. 12 is a transmission electron micrograph of mixed hydrated cerium oxide and neodymium oxide as described in Example 9, aged 7 days in reaction products prior to washing.

FIG. 12 shows a transmission electron micrograph of a sample taken after ageing which consisted of nanorods having a diameter of approximately 10-50 nm, 0.3-1.0 μm long and having an aspect ratio around 20:1. The corresponding BET surface area was 111 $m^2/g$. X-ray diffraction measurements revealed broad peaks corresponding to hydrated cerium (IV) oxide, but with peaks shifted relative to expected positions for the corresponding pure compound. After calcination at 500° C., x-ray diffraction measurements again revealed shifted peaks corresponding to cerium (IV) oxide, the corresponding BET surface area was 94 $m^2/g$.

EXAMPLE 10

CeCl3/NH4OH Elevated Temperature

An aqueous solution of the formula $MX_3$ was formed by dissolving 5.85 g $CeCl_3.7H_2O$ in 294 g Deionised water. A basic solution made up of 86 g $NH_4OH$ at 1.1 mol/l was added drop wise whilst stirring, leading to a concentration of 0.04 mol/l Ce(III) ion. A gelatinous precipitate was observed which was light purple in colour. The reaction product of the formula MX was $NH_4Cl$. The resulting slurry of the precipitate and the reaction product was stirred for 5 minutes, the resulting pH was 9.6.

The slurry was aged at 80° C. in the presence of the reaction product for 18 hours in a sealed container. The slurry was cooled to ambient temperature and washed by centrifugation using Deionised water, with dilute NH$_4$OH being added where necessary during washing in order maintain a pH of approximately 9.5 throughout. The sample was repeatedly washed until the conductivity of the wash water measured less than 100 μS/cm. A portion of the sample was used for electron microscopy studies with the remainder of the sample being dried at 40° C. and used for BET surface area and x-ray diffraction measurement.

Figure 13:
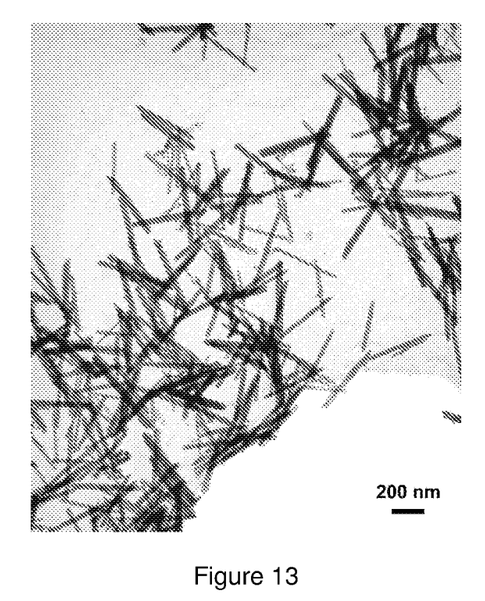
FIG. 13 is a transmission electron micrograph of hydrated cerium oxide as described in Example 10, aged 18 hours in reaction products prior to washing; and, FIG. 14 is a transmission electron micrograph of hydrated lanthanum oxide as described in Example 11, aged 48 hours in reaction products prior to washing.

FIG. 13 shows a transmission electron micrograph of the sample aged in reaction products for 18 hours at 80° C. prior to washing. The sample consisted of nanorods having a diameter of 15-60 nm, 0.2-1.0 μm long and having an aspect ratio around 20:1. Each nanorod had a nanocrystalline, fibrous type substructure, however, unlike samples synthesised under ambient conditions, rods did not appear to consist of bundles of whiskers and had prismatic ends. X-ray diffraction measurements revealed broad peaks corresponding to CeO$_2$ or hydrated CeO$_2$, the corresponding BET surface area was 62 m$^2$/g.

EXAMPLE 11

LaBr3/NH4OH Process Leading to La(OH)3 Rods

An aqueous solution of the formula MX$_3$ and having a La$^{3+}$ ion concentration of 0.05 mol/l was prepared by dissolving 2.980 g of La(OH)$_3$ in a HBr solution containing 8.0 g 48% HBr and 306 g Deionised water. Whilst stirring, 23.5 g of 8 mol/l NH$_4$OH solution was added dropwise. A white gelatinous precipitate was observed. The reaction product of the formula MX in this example was NH$_4$Br. The resultant slurry pH was 9.6, the slurry was stirred for a further 5 minutes. The temperature used for this example was ambient (in the order of 20° C.).

The resulting precipitate was allowed to age in reaction product for 48 hours under ambient conditions in a screw top container. The sample was then washed by centrifugation, using Deionised water, dilute NH$_4$OH was added where necessary during washing in order maintain a pH of approximately 9.5 throughout. The sample was repeatedly washed until the conductivity of the wash water measured less than 100 μS/cm.

Figure 14:
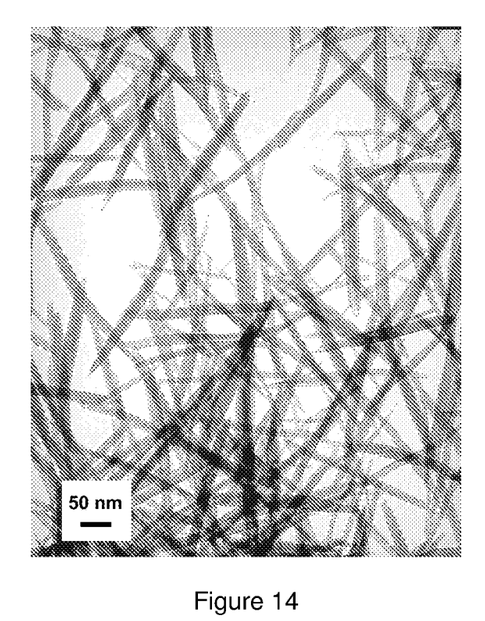

FIG. 14 shows a transmission electron micrograph of the sample aged in the presence of the reaction products for 48 hours prior to washing. The sample consisted of nanorods having a diameter of approximately 10-50 nm, a length of 0.1-0.6 μm and an aspect ratio of approximately 15:1. Each nanorod exhibited a nano sub-structure, similar to that exhibited by hydrated cerium oxide rod-like particles described in Example 1. X-ray diffraction measurements revealed broad peaks corresponding to lanthanum hydroxide, the corresponding BET surface area was 72 m$^2$/g.

Now that several embodiments of the invention have been described in detail, it will be apparent to persons skilled in the chemical engineering arts that numerous variations and modifications can be made without departing from the basic inventive concepts. For example, the hydroxide nanorods may be doped with other elements, for example by immersing the hydroxide nanorods into aqueous solution containing a second rare earth element. Alternatively or additionally, the hydroxide nanorods may be subjected to further treatment to produce nanorods of their equivalent oxides, sulfides, oxysulfides, or oxide-halide composites such as oxybromides, oxychlorides, or hydroxyfluorides. Equally, the surface of the rare earth hydroxide nanorods may act as active sites for possible surface modification treatment through condensation reactions with amino acids or biologically active molecules to render them useful for medical applications. All such modifications and variations are considered to be within the scope of the present invention, the nature of which is to be determined from the foregoing description and the appended claims.

The invention claimed is:

1. A process for the production of nanorods containing a rare earth metal, the process comprising the steps of:
    (a) increasing the pH of an aqueous solution of the formula MX$_3$, wherein M is a trivalent rare earth metal cation and X is at least one halide anion, so as to produce a reaction product containing X anions in solution and a precipitate in the form of trivalent rare earth hydroxide nanoparticles of the formula M(OH)$_3$, the nanoparticles having a hexagonal crystal structure; and
    (b) ageing the nanoparticles of step (a) in the presence of the reaction product containing X anions in solution so as to facilitate rod-like anisotropic growth of the nanoparticles and form rare earth hydroxide nanorods, wherein the step of ageing is conducted at atmospheric pressure and at a temperature less than 80° C.

2. The process of claim 1, wherein the step of increasing the pH comprises the step of introducing a base or basic solution to the aqueous solution of the formula MX$_3$.

3. The process of claim 2, wherein the basic solution comprises ammonia.

4. The process of claim 1, further comprising the step of washing the nanorods after the step of ageing using one or more washing cycles.

5. The process of claim 4, further comprising the step of drying the washed nanorods.

6. The process of claim 1, further comprising the step of calcining the nanorods to produce nanorods of an equivalent rare earth oxide.

7. The process of claim 1, further comprising the step of sulfurising the nanorods to produce nanorods of an equivalent rare earth sulfide or oxysulfide.

8. The process of claim 7, wherein the monovalent anion X comprises chloride.

9. The process of claim 7, wherein the step of ageing is conducted at ambient temperature.

10. The process of claim 1, wherein the trivalent rare earth metal cation M is cerium and the step of ageing is conducted under reducing conditions so as to maintain the cerium ions in a trivalent oxidation state.

11. The process of claim 1, wherein M is cerium and the process further comprises the step of oxidizing Ce(III) to Ce(IV) state after the step of aging to produce nanorods of Ce(IV) oxide.

12. The process of claim 1, wherein the step of ageing is conducted at a temperature less than 60° C.

13. The process of claim 1, wherein the step of ageing is conducted at a temperature less than 40° C.

14. The process of claim 1, wherein the rare earth hydroxide nanorods are solid.

15. The process of claim 1, wherein the step of ageing is conducted for up 2 hours.

16. The process of claim 1, wherein the step of ageing is conducted for up to 8 hours.

17. The process of claim 1, wherein the step of ageing is conducted for up to 15 hours.

18. The process of claim 1, wherein the pH is increased above 8.

19. The process of claim 1, wherein the pH is increased above 9.

20. The process of claim 1, wherein the pH is increased above 9.5.

21. The process of claim 1, wherein the pH is increased above 10.

* * * * *